(12) United States Patent
Kim

(10) Patent No.: US 7,397,724 B2
(45) Date of Patent: Jul. 8, 2008

(54) WORD LINE DECODER SUITABLE FOR LOW OPERATING VOLTAGE OF FLASH MEMORY DEVICE

(75) Inventor: Ho-jung Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 187 days.

(21) Appl. No.: 11/481,363

(22) Filed: Jul. 5, 2006

(65) Prior Publication Data
US 2007/0008806 A1    Jan. 11, 2007

(30) Foreign Application Priority Data
Jul. 6, 2005    (KR) ...................... 10-2005-0060789

(51) Int. Cl.
*G11C 8/00* (2006.01)
(52) U.S. Cl. ............. 365/233; 365/230.03; 365/230.06; 365/226
(58) Field of Classification Search .............. 365/233, 365/230.03, 230.06, 226
See application file for complete search history.

(56) References Cited
U.S. PATENT DOCUMENTS
6,621,735 B2    9/2003    Nakamura et al. ..... 365/185.17
7,123,528 B2 *  10/2006   Jeong et al. ................. 365/201
7,286,402 B2 *  10/2007   Nakamura et al. ..... 365/185.17

FOREIGN PATENT DOCUMENTS
JP    11-232883    8/1999
JP    2001-102916   4/2001

* cited by examiner

*Primary Examiner*—Pho M. Luu
(74) *Attorney, Agent, or Firm*—Mills & Onello LLP

(57) ABSTRACT

Provided is a word line decoder suitable to a low operating voltage of a flash memory device. The word line decoder generates a block word line driving signal of a high voltage in response to a block selection signal. The word line decoder includes a first inverter receiving the block selection signal, a second inverter receiving an output of the first inverter, and first and second serially connected transistors receiving an output of the second inverter and outputting the block word line driving signal. The gates of the first and second transistors are connected to a supply voltage terminal. The word line decoder includes a third transistor having a source connected to a high voltage terminal and a gate connected to a line transmitting the block word line driving signal, a fourth transistor connected between the drain of the third transistor and the block word line driving signal line, a fifth transistor connected between the drain of the third transistor and the gate of the fourth transistor and having a gate connected to the block word line driving signal line, and a sixth transistor connected between the output of the first inverter and the gate of the second transistor and having a gate connected to the supply voltage terminal.

14 Claims, 3 Drawing Sheets

WORD LINE DECODER SUITABLE FOR LOW OPERATING VOLTAGE OF FLASH MEMORY DEVICE

CROSS-REFERENCE TO RELATED PATENT APPLICATIONS

This application claims the benefit of Korean Patent Application No. 10-2005-0060789, filed on Jul. 6, 2005, in the Korean Intellectual Property Office, the contents of which are incorporated herein in their entirety by reference.

BACKGROUND OF THE INVENTION

1. Field of the Invention

The present invention relates to a semiconductor memory device, and more particularly, to a word line decoder which transfers a high voltage in a flash memory device having a low operating voltage.

2. Description of the Related Art

As digital information communication networks such as the Internet through mobile terminals and cellular phones have grown, non-volatile semiconductor memory devices have been viewed as one of the main contenders for nonvolatile storage of information in mobile terminals. Non-volatile memories include flash memories which can electrically erase stored data in blocks of predetermined numbers of bits and electrically write data.

A flash memory device, which is comprised of a plurality of sectors each including a plurality of memory cells, erases memory cell data in units of a block (sector) and performs programming (writing) in units of a memory cell. Since NAND-type flash memory devices have a degree of integration and memory capacity similar to dynamic RAMs, the uses and applications of such NAND-type flash memories are being gradually increased.

A NAND-type flash memory device has a structure where a memory string in which a plurality of memory cells are connected in series to one another is connected between a bit line and a source line, wherein a plurality of memory strings constitutes a memory cell array.

FIG. 1 is a view illustrating a conventional flash memory device 100. Referring to FIG. 1, the flash memory device 100 includes a block memory cell array 110 and a word line decoder 120. The flash memory device 100 can include a plurality of block memory cell arrays, in which case word line decoders are positioned in such a manner that they correspond one-to-one to the block memory cell arrays. For the convenience of description, in this specification, only one word line decoder 120 and a corresponding block memory cell array 110 are described.

The block memory cell array 110 is comprised of memory strings CS which are respectively connected to n bit lines $BL_0, BL_1, \ldots, BL_{n-1}$. The memory strings CS are connected in common to a source line CSL. The gates of memory cells M0 through M15 in each memory string CS are respectively connected to word lines WL0 through WL15. The gates of string selection transistors SST for connecting the memory strings CS to the respective bit lines $BL_0, BL_1, \ldots, BL_{n-1}$ are connected to a string selection line SSL. The gates of ground selection transistors GST for connecting the memory strings CS to the common source line CSL are connected to a ground selection line GSL.

The word line decoder 120 selectively activates the string selection line SSL, the ground selection line GSL, and the word lines WL0 through WL15 of the memory cell array 110. The word line decoder 120 includes a decoding unit 122 which receives address signals ADDR and generates a block word line driving signal BLKWL, word line driving signals S0 through S15, a string selection voltage VSSL and a ground selection voltage VGSL and a word line driver 124 which transfers the word line driving signals S0 through S15, the string selection voltage VSSL and the ground selection voltage VGSL to the word lines WL0 through WL15, the string selection line SSL and the ground selection line GSL, respectively, in response to the block word line driving signal BLKWL.

The decoding unit 122 decodes the received address signals ADDR, and provides corresponding driving voltages (for example, a program voltage $V_{pgm}$, an erase voltage $V_{erase}$, or a read voltage $V_{read}$) to each of the string selection line SSL, the word lines WL0 through WL15 and the ground selection line GSL, in a program operation, in an erase operation, or in a read operation. Also, the decoding unit 122 receives a high voltage $V_{pp}$ and outputs it as the block word line driving signal BLKWL.

The word line driver 124 includes high-voltage pass transistors SN, WN0-WN15, GN, and CN, which are connected between the string selection voltage VSSL and the string selection line SSL, between the word line driving signals S0 through S15 and the word lines WL0 through WL15, between the ground selection voltage VGSL and the ground selection line GSL, and between the common source line voltage VCSL and the common source line CSL, respectively. The gates of the high-voltage pass transistors SN, WN0-WN15, GN, and CN are connected to each other and connected to the block world line driving signal BLKWL.

FIG. 2 is a circuit diagram of a circuit for generating the block word line driving signal BLKWL in the decoding unit 122.

Referring to FIG. 2, the decoding unit 122 makes the block word line driving signal BLKWL transition to a high voltage $V_{pp}$ in response to a block selection signal BLKi. The block selection signal BLKi, which is generated by receiving and decoding address signals ADDR, is used when selecting a block memory cell array 110.

The block selection signal BLKi is input to a first inverter 201. An output of the first inverter 201 is input to a second inverter 202 and an output of the second inverter 202 is output as a word line driving signal BLKWL via an NMOS transistor 203 and a first depletion transistor 204. A supply voltage VDD is applied to the gates of the NMOS transistor 203 and the first depletion transistor 204. The first and second inverters 201 and 202 are driven by the supply voltage VDD.

The decoding unit 122 further includes a second depletion transistor 205 and a PMOS transistor 206 which are connected in series between a high voltage $V_{pp}$ terminal and a block word line driving signal BLKWL line. The gate of the second depletion transistor 205 is connected to the block word line driving signal BLKWL line and the gate of the PMOS transistor 206 is connected to the output of the first inverter 201.

The decoding unit 122 forms an improper current path A resulting in an increase in power consumption if the supply voltage VDD falls below 1.8V, due to a low operating voltage of the flash memory device.

It is assumed that the threshold voltage Vth of the first and second depletion transistors 204 and 205 is about −2.2 V and the high voltage $V_{pp}$ is about between 20 V and 22 V. If the block selection signal BLKi goes low, the output of the first inverter 201 goes high and the output of the second inverter 202 goes low. The output of the second inverter 202, which is low, is transmitted, via the NMOS transistor 203 and the first depletion transistor 204 and output as the block word line driving signal BLKWL.

Here, the PMOS transistor 206 must be turned off when the output of the first inverter 201 goes high. However, as the supply voltage VDD lowers, the PMOS transistor 206 is turned on.

If the block word line driving signal BLKWL goes to a ground voltage level grounded, the decoding unit 122 forms a DC current path A from the high voltage $V_{pp}$ to the ground voltage GND via the second depletion transistor 205, the PMOS transistor 206, the first depletion transistor 204, the NMOS transistor 203 and an NMOS transistor (not shown) of the second inverter 202. Due to the DC current path A, power consumption increases.

Therefore, in order to reduce power consumption, a word line decoder which is capable of preventing an improper current path from being formed even when a supply voltage VDD falls, is needed.

SUMMARY OF THE INVENTION

The present invention provides a word line decoder suitable for a low supply voltage.

According to an aspect of the present invention, there is provided a word line decoder for generating a block word line driving signal in a flash memory device, comprising: a first inverter receiving a block selection signal; a second inverter receiving an output of the first inverter; first and second serially connected transistors having gates connected to a supply voltage, receiving an output of the second inverter and outputting the block word line driving signal; a third transistor having a source connected to a high voltage terminal and a gate connected to a line transmitting the block word line driving signal; a fourth transistor connected between a drain of the third transistor and the block word line driving signal line; a fifth transistor connected between a drain of the third transistor and a gate of the fourth transistor and having a gate connected to the block word line driving signal line; and a sixth transistor connected between the output of the first inverter and the gate of the second transistor and having a gate connected to the supply voltage terminal.

According to another aspect of the present invention, there is provided a word line decoder for generating a block word line driving signal in a flash memory device, comprising: a first inverter receiving a block selection signal; a second inverter receiving an output of the first inverter; first and second serially connected transistors having gates connected to a supply voltage, receiving an output of the second inverter and outputting the block word line driving signal; a third transistor having a source connected to a high voltage terminal and a gate connected to a line transmitting the block word line driving signal; a fourth transistor connected between a drain of the third transistor and the block word line driving signal line; a fifth transistor connected between the high voltage and a gate of the fourth transistor and having a gate connected to a node between the third and fourth transistors; and a sixth transistor connected between the output of the first inverter and a gate of the second transistor and having a gate connected to the supply voltage terminal.

According to certain embodiments of the present invention, the first transistor can be an NMOS transistor, the second and third transistors can be depletion NMOS transistors, the fourth and fifth transistors can be PMOS transistors, and the sixth transistor can be an NMOS transistor.

Therefore, in a word line decoder according to the present invention, it is possible to reduce power consumption by blocking a DC current path from a high voltage to a ground voltage even when a supply voltage is reduced.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 3:
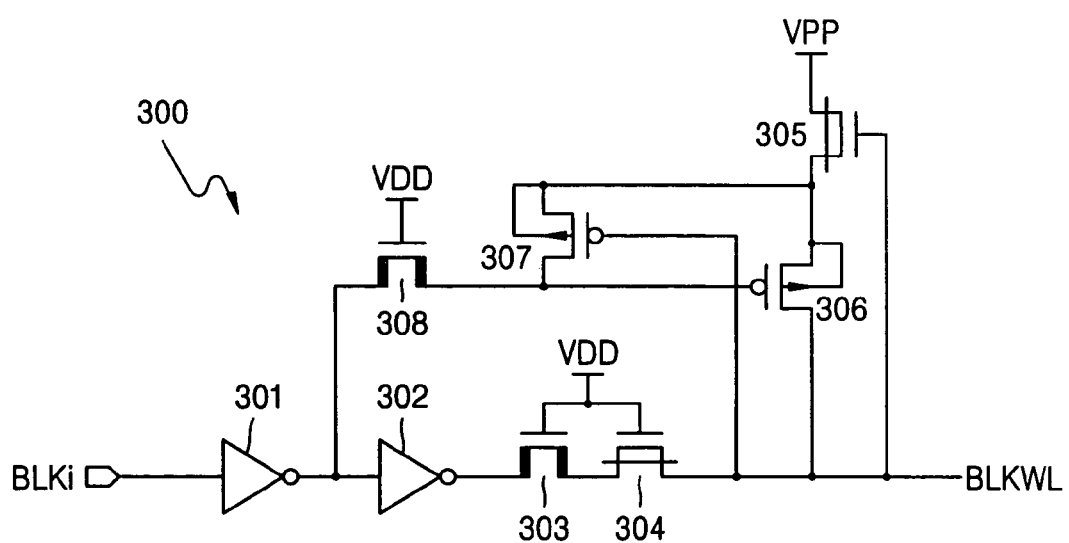
FIG. 3 is a circuit diagram of a word line decoding unit according to a first embodiment of the present invention.

FIG. 3 is a circuit diagram of a word line decoding unit 300 according to a first embodiment of the present invention.

Figure 1:
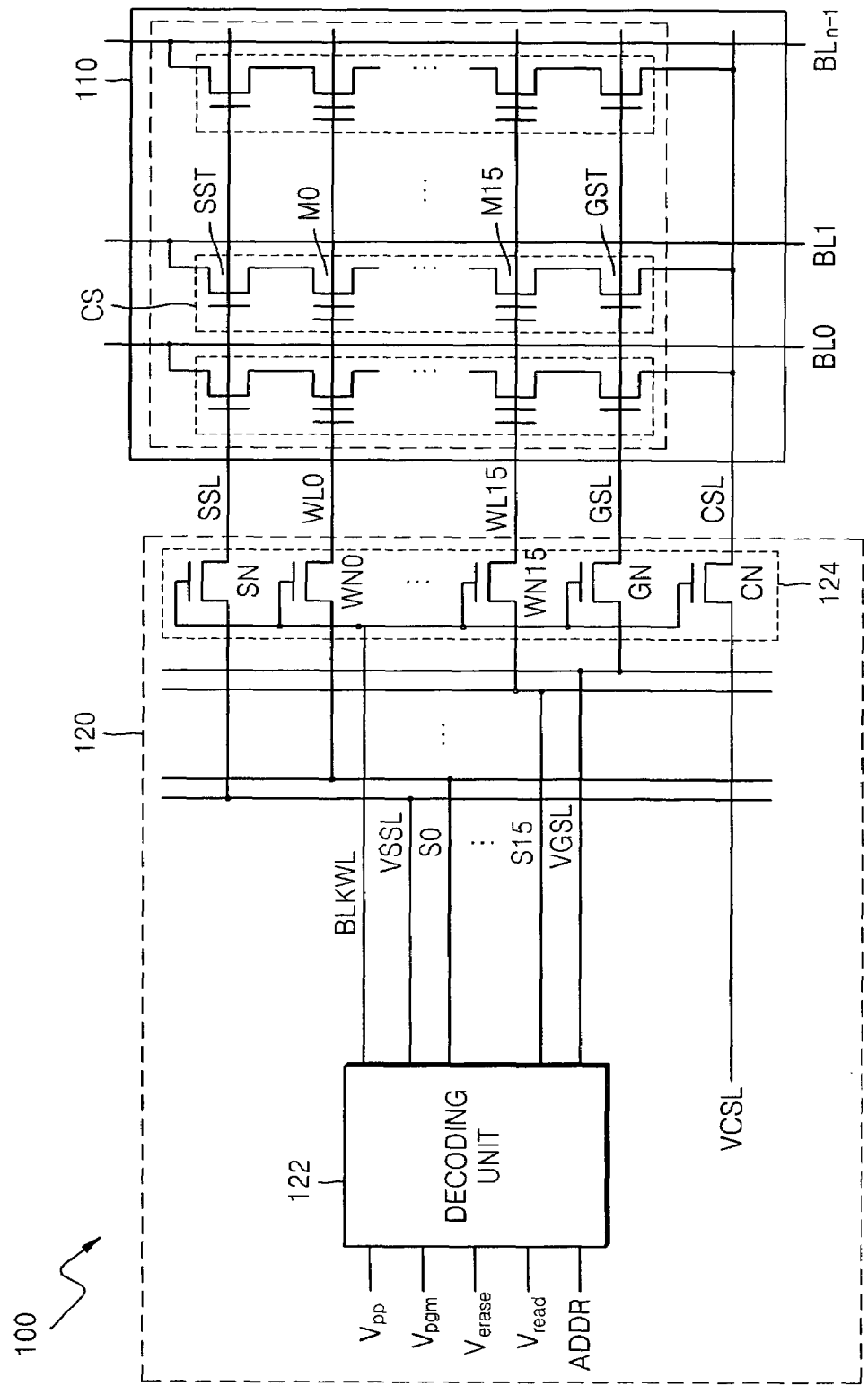
FIG. 1 is a view illustrating a conventional flash memory device.

Referring to FIG. 3, the word line decoding unit 300 of the invention may be included in the word line decoder 120 illustrated in FIG. 1. The word line decoding unit 300 includes a first inverter 301 which receives a block selection signal BLKi. The output of the first inverter 301 is input to a second inverter 302 and the output of the second inverter 302 is transmitted via a first NMOS transistor 303 and a first depletion NMOS transistor 304 and output as a block word line driving signal BLKWL. The first and second inverter 301 and 302 are driven by a supply voltage VDD. The gates of the first NMOS transistor 303 and the first depletion NMOS transistor 304 are connected to the supply voltage VDD.

The word line decoding unit 300 further includes a second depletion NMOS transistor 305 and a first PMOS transistor 306 which are connected in series between a high voltage ($V_{pp}$) terminal and the block word line driving signal (BLKWL) line. The gate of the second depletion NMOS transistor 305 is connected to the block word line driving signal (BLKWL) line.

In addition, a second PMOS transistor 307 is connected between the drain of the second depletion NMOS transistor 305 and the gate of the first PMOS transistor 306, and a second NMOS transistor 308 is connected between the output of the first inverter 301 and the gate of the first PMOS transistor 306. The gate of the second PMOS transistor 307 is connected to the block word line driving signal (BLKWL) line. The gate of the second NMOS transistor 308 is connected to the supply voltage VDD.

Hereinafter, the operation of the word line decoding unit 300 will be described.

First, if a block selection signal BLKi input to the first and second inverters 301 and 302, the first NMOS transistor 303 and the first depletion NMOS transistor 304 goes low, a block word line driving signal BLKWL output from the first depletion NMOS transistor 304 goes low. If the word line driving signal BLKWL goes low, the second PMOS transistor 307 is turned on and a high voltage $V_{pp}$ is applied to the gate of the first PMOS transistor 306. Accordingly, the first PMOS transistor 306 is turned off.

Meanwhile, if the block selection signal BLKi goes low, the output of the first inverter 301 goes high, i.e., it becomes the supply voltage VDD. The output of the first inverter 301 having the supply voltage VDD is transferred to the gate of the first PMOS transistor 306 through the second NMOS transistor 308.

The supply voltage VDD is applied to the gate of the first PMOS transistor 306 through the second NMOS transistor 308. However, when the block word line driving signal BLKWL is low, the second PMOS transistor 307 is turned on and tries to drive the gate of the first PMOS transistor 306 at the high voltage level $V_{pp}$. That is, the voltage of the gate of the first PMOS transistor 306 is decided by the high voltage $V_{pp}$ transferred through the second PMOS transistor 307, rather than the supply voltage VDD transferred through the second NMOS transistor 308.

Figure 2:
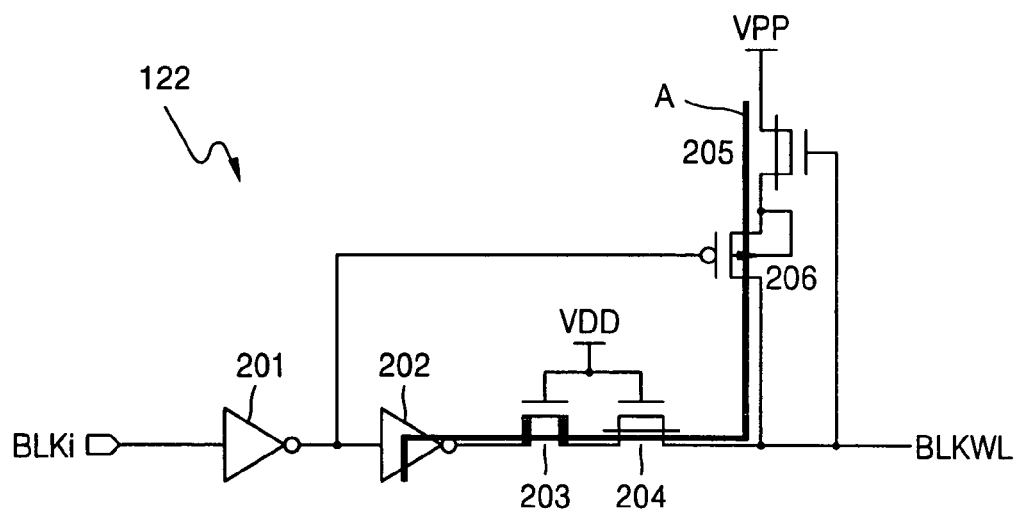
FIG. 2 is a circuit diagram of a conventional word line decoding unit.

Accordingly, since the voltage of the gate of the first PMOS transistor 306 is maintained at the high voltage $V_{pp}$ even when the supply voltage VDD falls, the decoding unit 300 completely turns off the first PMOS transistor 306. Therefore, a DC current path A as in the conventional decoding unit 120 (see FIG. 2) is not formed.

Second, if the block selection signal BLKi input to the first and second inverters 301 and 302, the first NMOS transistor 303 and the first depletion NMOS transistor 304 goes high, the block word line driving signal BLKWL output from the first depletion NMOS transistor 304 goes high. If the block word line driving signal BLKWL goes high, the second PMOS transistor 307 is turned on. Then, the output of the first inverter 301 which is low is applied to the gate of the first PMOS transistor 306, so that the first PMOS transistor 306 is turned on. The block word line driving signal BLKWL is pulled up to the high voltage $V_{pp}$ by the second depletion NMOS transistor 305 and the first PMOS transistor 306.

Figure 4:
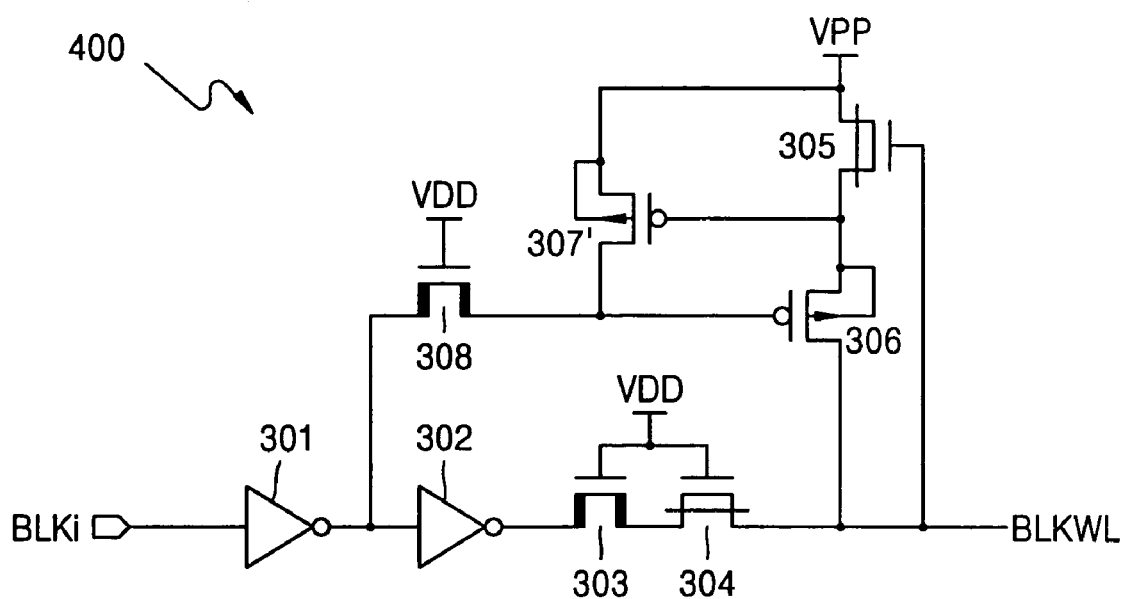
FIG. 4 is a circuit diagram of a word line decoding unit according to a second embodiment of the present invention.

FIG. 4 is a view illustrating a word line decoding unit 400 according to a second embodiment of the present invention.

The configuration of the word line decoding unit 400 illustrated in FIG. 4 is similar to that of the word line decoding unit 300 illustrated in FIG. 3, except for a second PMOS transistor 307'.

The source of the second PMOS transistor 307' is connected to a high voltage $V_{pp}$, the gate of the second PMOS transistor 307' is connected to a node between the second depletion NMOS transistor 305 and the first PMOS transistor 306, and the drain of the second PMOS transistor 307' is connected to the gate of a first PMOS transistor 306.

If a block selection signal BLKi input to first and second inverters 301 and 302, a first NMOS transistor 303 and a first depletion NMOS transistor 304 goes low, a block word line driving signal BLKWL output from the first depletion NMOS transistor 304 goes low. The second NMOS transistor 308 is turned off when an output of the first inverter 301 goes high. Then, if a high voltage $V_{pp}$ is applied, the high voltage $V_{pp}$ is supplied to the gate of the first PMOS transistor 306 through the second transistor 307', so that the first PMOS transistor 306 is turned off.

If the block selection signal BLKi input to the first and second inverters 301 and 302, the first NMOS transistor 303, and the first depletion NMOS transistor 304 goes high, the block word line driving signal BLKWL output from the first depletion NMOS transistor 304 goes high. The output of the first inverter 301 which is low is transferred to the gate of the first PMOS transistor 306 through the second NMOS transistor 308. The high voltage $V_{pp}$ is applied to the gate of the second PMOS transistor 307', so that the second PMOS transistor 307' is turned off.

Accordingly, since the first PMOS transistor 306 is completely turned off by the second NMOS transistor 308 and the second PMOS transistor 307 even when a supply voltage VDD falls, a DC current path as in the conventional word line decoding unit 120 (see FIG. 2) is not formed.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A word line decoder for generating a block word line driving signal in a flash memory device, comprising:
   a first inverter receiving a block selection signal;
   a second inverter receiving an output of the first inverter;
   first and second serially connected transistors having gates connected to a supply voltage, receiving an output of the second inverter and outputting the block word line driving signal;
   a third transistor having a source connected to a high voltage terminal and a gate connected to a line transmitting the block word line driving signal;
   a fourth transistor connected between a drain of the third transistor and the block word line driving signal line;
   a fifth transistor connected between a drain of the third transistor and a gate of the fourth transistor and having a gate connected to the block word line driving signal line; and
   a sixth transistor connected between the output of the first inverter and the gate of the second transistor and having a gate connected to the supply voltage terminal.

2. The word line decoder of claim 1, wherein the first transistor is an NMOS transistor.

3. The word line decoder of claim 1, wherein the second transistor is a depletion NMOS transistor.

4. The word line decoder of claim 1, wherein the third transistor is a depletion NMOS transistor.

5. The word line decoder of claim 1, wherein the fourth transistor is a PMOS transistor.

6. The word line decoder of claim 1, wherein the fifth transistor is a PMOS transistor.

7. The word line decoder of claim 1, wherein the sixth transistor is an NMOS transistor.

8. A word line decoder for generating a block word line driving signal in a flash memory device, comprising:
   a first inverter receiving a block selection signal;
   a second inverter receiving an output of the first inverter;
   first and second serially connected transistors having gates connected to a supply voltage, receiving an output of the second inverter and outputting the block word line driving signal;
   a third transistor having a source connected to a high voltage terminal and a gate connected to a line transmitting the block word line driving signal;
   a fourth transistor connected between a drain of the third transistor and the block word line driving signal line;
   a fifth transistor connected between the high voltage and a gate of the fourth transistor and having a gate connected to a node between the third and fourth transistors; and
   a sixth transistor connected between the output of the first inverter and a gate of the second transistor and having a gate connected to the supply voltage terminal.

9. The word line decoder of claim 8, wherein the first transistor is an NMOS transistor.

10. The word line decoder of claim 8, wherein the second transistor is a depletion NMOS transistor.

11. The word line decoder of claim 8, wherein the third transistor is a depletion NMOS transistor.

12. The word line decoder of claim 8, wherein the fourth transistor is a PMOS transistor.

13. The word line decoder of claim 8, wherein the fifth transistor is a PMOS transistor.

14. The word line decoder of claim 8, wherein the sixth transistor is an NMOS transistor.

* * * * *